US010854807B2

(12) United States Patent
Rouxel et al.

(10) Patent No.: US 10,854,807 B2
(45) Date of Patent: Dec. 1, 2020

(54) PIEZOELECTRIC SENSOR AND INSTRUMENT INCLUDING SUCH A SENSOR

(71) Applicant: UNIVERSITÉ DE LORRAINE, Nancy (FR)

(72) Inventors: Didier Rouxel, Pont-Saint-Vincent (FR); Brice Vincent, Tomblaine (FR); Laurent Badie, Vandoeuvre-lès-Nancy (FR)

(73) Assignee: UNIVERSITÉ DE LORRAINE, Nancy (FR)

( * ) Notice: Subject to any disclaimer, the term of this patent is extended or adjusted under 35 U.S.C. 154(b) by 327 days.

(21) Appl. No.: 15/561,499

(22) PCT Filed: Mar. 24, 2016

(86) PCT No.: PCT/FR2016/050650
§ 371 (c)(1),
(2) Date: Sep. 25, 2017

(87) PCT Pub. No.: WO2016/151252
PCT Pub. Date: Sep. 29, 2016

(65) Prior Publication Data
US 2018/0069170 A1 Mar. 8, 2018

(30) Foreign Application Priority Data
Mar. 25, 2015 (FR) .................... 15 52487

(51) Int. Cl.
H01L 41/113 (2006.01)
G01H 11/08 (2006.01)
(Continued)

(52) U.S. Cl.
CPC .......... H01L 41/1138 (2013.01); G01H 11/08 (2013.01); H01L 41/02 (2013.01); H01L 41/183 (2013.01)

(58) Field of Classification Search
CPC ...... H01L 41/1138; B06B 1/06; B06B 1/0644
(Continued)

(56) References Cited

U.S. PATENT DOCUMENTS

2002/0000763 A1* 1/2002 Jones ............... A61B 17/22012
310/337
2009/0015104 A1* 1/2009 Kimura ................. B06B 1/0618
310/334
(Continued)

FOREIGN PATENT DOCUMENTS

CN 101781461 A 7/2010
CN 104157784 A 11/2014
(Continued)

OTHER PUBLICATIONS

International Search Report for PCT Patent App. No. PCT/FR2016/050650 dated May 31, 2016 with English language translation thereof.
(Continued)

Primary Examiner — Derek J Rosenau
(74) Attorney, Agent, or Firm — Kenealy Vaidya LLP

(57) ABSTRACT

Some embodiments are directed to a piezoelectric sensor, including a body with a central cavity; and a membrane extending over the cavity, which membrane is fastened to the body via its periphery and includes a carrier layer made of polymer and a sensitive layer made of piezoelectric polymer, the membrane being able to deform or vibrate. The sensitive layer is made of a material including a polymer filled with inorganic nanomaterials. Instrument including such a sensor.

8 Claims, 4 Drawing Sheets

(51) Int. Cl.
*H01L 41/18* (2006.01)
*H01L 41/02* (2006.01)

(58) Field of Classification Search
USPC .................................................. 310/322, 334
See application file for complete search history.

(56) References Cited

U.S. PATENT DOCUMENTS

| | | |
|---|---|---|
| 2011/0137109 A1 | 6/2011 | Zahnert et al. |
| 2011/0166459 A1 | 7/2011 | Kopetsch et al. |
| 2012/0193568 A1* | 8/2012 | Liu .............................. C08J 3/21 |
| | | 252/62.9 R |
| 2014/0180117 A1 | 6/2014 | Van Hoven |
| 2015/0042210 A1* | 2/2015 | Nagareda ............ H01L 41/1873 |
| | | 310/334 |
| 2017/0373243 A1* | 12/2017 | Ozawa .................... H01L 41/29 |

FOREIGN PATENT DOCUMENTS

| | | |
|---|---|---|
| EP | 1519165 A2 | 3/2005 |
| EP | 2545960 A1 | 1/2013 |
| JP | H02-119963 A | 5/1990 |
| JP | H04-075924 U | 7/1992 |
| JP | H06-351099 A | 12/1994 |
| WO | 2012018400 A1 | 2/2012 |
| WO | 2014185530 A1 | 11/2014 |

OTHER PUBLICATIONS

Written Opinion for PCT Patent App. No. PCT/FR2016/050650 dated May 31, 2016.

\* cited by examiner

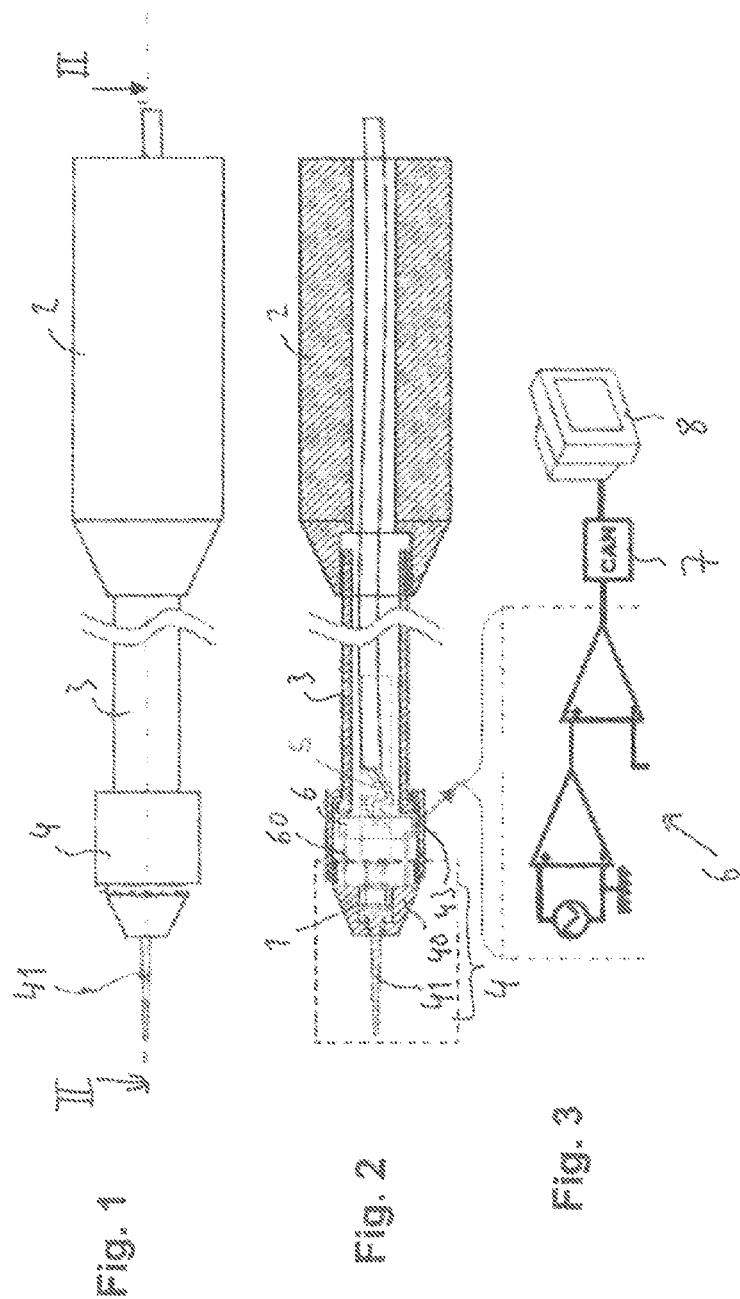

PIEZOELECTRIC SENSOR AND INSTRUMENT INCLUDING SUCH A SENSOR

CROSS REFERENCE TO RELATED APPLICATION(S)

This application is a national phase filing under 35 C.F.R. § 371 of PCT Patent Application No. PCT/FR2016/050650, filed on Mar. 24, 2016, and claims the related benefit under 35 U.S.C. § 119 of French Patent Application No. 1552487, filed on Mar. 25, 2015, the contents of each of which are hereby incorporated in their entireties by reference.

BACKGROUND

Some embodiments relate to a piezoelectric sensor for measuring low amplitude vibrations and of lightweight objects. Some other embodiments relate to an instrument for measuring vibrations, in particular for medical use.

The medical field may require various sensors, in particular acoustic sensors, in applications relating to hearing and the correction thereof. These sensors must or should be compact and sensitive to a range of frequencies in the audible domain.

Document WO 2012/018400 A1 discloses a sound sensor intended to pick up ambient sound and transmit it to an implant in the ear. The sensor is intended to be implanted under the skin. The sensor uses a PVDF membrane for its piezoelectric properties so that the sound waves are transformed into electrical signals. In the case of cochlear implants, the electrical signals are sent by conductors to the auditory nerve. In some of the presented configurations, the membrane is attached to an annular body so as to extend over a central cavity of the body. In addition, the piezoelectric sensitive layer can be covered by a layer of silicone elastomer, for example in the shape of a lens.

Document US 2011/0137109 A1 shows an auditory sensor intended to be implanted in the middle ear at the interface between two ossicles, with a membrane in contact with the first of the ossicles, the sensor body or another membrane bearing against the other ossicle. The sensor also includes a piezoelectric sensitive element connected to the membrane in order to generate electrical signals.

Such a sensor includes an interface between the membrane and the sensitive element, which interface leads to transmission losses depending on frequency. It also may require spring elements to keep the sensitive element in contact with the membrane, which makes it complex to manufacture.

Some embodiments aims to provide a piezoelectric sensor for the measurement of vibrations or small displacements which is adapted to sound frequencies, exhibits good sensitivity and is simple to produce. It also relates to an instrument for measuring vibrations, in particular for medical use.

SUMMARY

In light of these objectives, the subject of the presently disclosed subject matter is a piezoelectric sensor including a body with a central cavity, a membrane extending over the cavity, which membrane is attached to the body via its periphery and includes a carrier layer made of polymer and a sensitive layer made of piezoelectric synthetic material, the membrane being capable of deforming or vibrating, characterized in that the sensitive layer is made of a material including a polymer filled with inorganic nanomaterials.

In such a sensor, the membrane is the part that detects mechanical movement and that which converts this movement into an electrical signal. In addition, the sensitive layer is located directly on the outside so as to come into contact with the source of movements or vibrations. Thus, an interface between a membrane and a sensitive element is dispensed with. Furthermore, the insertion of nanomaterials into the polymer matrix makes it possible to adjust the acoustic impedance of the sensitive layer according to the desired application. It has been established that the insertion of nanomaterials, within certain limits, does not affect the piezoelectric properties of the sensitive layer. The proportion of nanomaterials can reach, for example, 20% by mass.

The presence of nanomaterials in the sensitive layer is central because it makes it possible to adjust the acoustic impedance of the sensitive layer according to the desired application. This makes it possible to optimize the transfer of acoustic energy from the probed object to the membrane. The variation in the elastic constants can reach more than 30%, which results in a favorable variation in the power transfer coefficient of more than 100%, depending on the mismatch in acoustic impedance between the object being probed and the matrix of the nanocomposite.

By way of examples, the polymer of the sensitive layer is selected from the group including polyvinylidene fluoride (PVDF), vinylidene fluoride and trifluoroethylene copolymer P(VDF-TrFE) and polyamide-11.

By way of examples, the nanomaterials are made of an inorganic material such as metals, semiconductors or dielectrics. These materials have a specific acoustic impedance and density, and the choice of material makes it possible to influence the final acoustic impedance of the sensitive layer. They can also provide intrinsic specific properties.

By way of examples, the carrier layer is made of a material selected from the group including polyimide (PI) and polyether ether ketone (PEEK).

According to certain features, the thickness of the carrier layer is between 5 and 150 µm, preferably 25 µm.

According to another feature, the membrane is attached to the body by bonding.

In particular, the membrane is attached to the body by the carrier layer.

In a complementary manner, a first conductive layer is interposed between the carrier layer and the sensitive layer. The first conductive layer makes it possible to collect the electric charges generated by the sensitive layer.

In a complementary manner, a second conductive layer is deposited on at least a portion of a free surface of the sensitive layer. The second conductive layer makes it possible to collect the electric charges generated by the sensitive layer. The two conductive layers make it possible to acquire the electrical signal.

Another subject of the presently disclosed subject matter also relates to an instrument, characterized in that it includes a sensor such as described above and a transmission rod, a first end of which is intended to be applied against a mass that is capable of vibrating and a second end of which bears against the membrane of the sensor.

Thus, the combination of the nanocomposite membrane with the transmission rod makes it possible to measure vibrations of very low amplitude on elements of small size (smaller than 1 mm).

Such an instrument is intended to measure the vibrations of the mass. It is intended in particular to carry out a check in the context of a surgical operation on the ear in order to verify that acoustic waves are being transmitted along the auditory transmission pathway. For example, the transmission rod may be applied against one of the ossicles of the middle ear in order to verify that it is receiving the acoustic waves picked up by the eardrum. The acoustic waves are transmitted to the sensor via the transmission rod. The sensor can be adjusted to the desired acoustic wave frequency range by selecting the acoustic impedance of the sensitive layer.

In a complementary manner, the instrument includes a head in which the sensor is housed, the rod being linked by elastic means to the head. Thus, the rod is decoupled from the head and can transmit its waves to the sensor without attenuation. In addition, the transmission rod can permanently bear against the sensitive layer of the sensor in order to ensure good coupling.

According to one design feature, the second end of the rod includes a domed surface for bearing against the membrane.

BRIEF DESCRIPTION OF THE DRAWINGS

Some embodiments will be better understood and other features and advantages will become apparent on reading the description which follows, the description making reference to the appended drawings, in which:

FIG. 1 is a view of an instrument in accordance with one embodiment of the presently disclosed subject matter;

FIG. 2 is a cross-sectional view along line II-II of FIG. 1;

FIG. 3 is a circuit diagram of the instrument of FIG. 1;

DETAILED DESCRIPTION OF EXEMPLARY EMBODIMENTS

Figure 4:
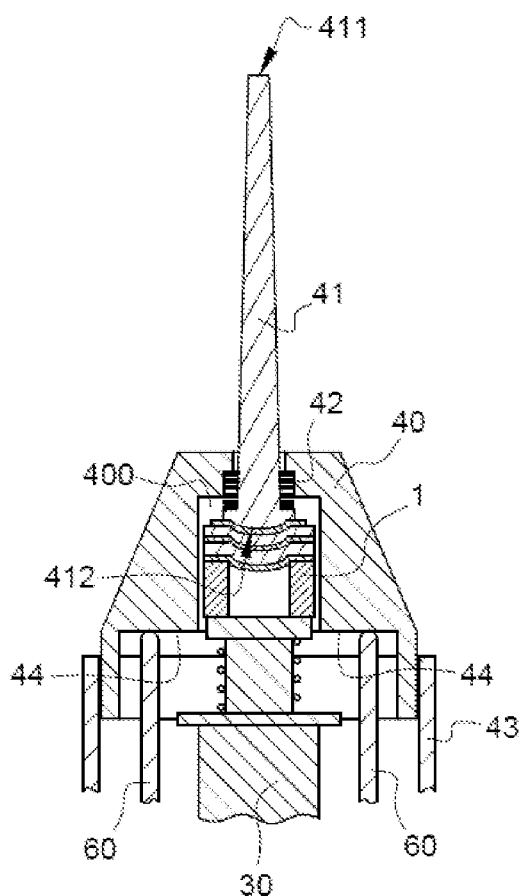
FIG. 4 is a view of detail IV from FIG. 2.
Figure 5:
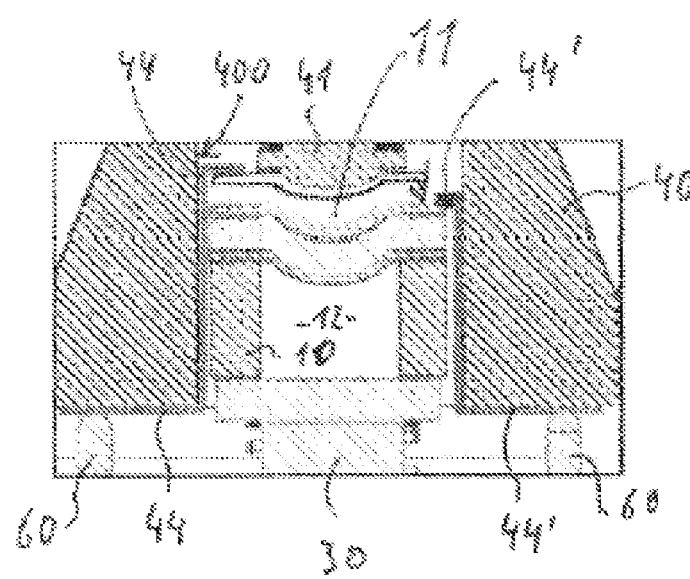
FIG. 5 is a view of detail V from FIG. 4.
Figure 6:
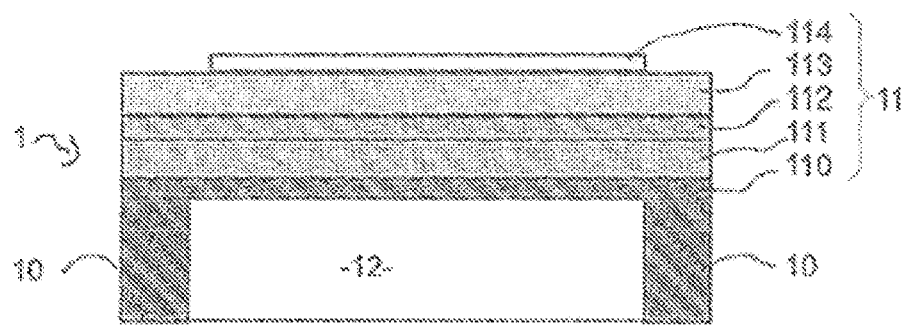
FIG. 6 is a view of a sensor incorporated in the instrument of FIG. 1.

An instrument in accordance with the disclosed subject matter is shown in FIGS. 1 to 5. The instrument includes a sensor 1 shown in particular in FIG. 6.

The instrument includes a handle 2 extended by a tube 3 at the end of which a head 4 is located. The head 4 incorporates the sensor 1 and a transmission rod 41, a first end 411 of which is intended to be applied against an object or a mass that is capable of vibrating. The head 4 includes a bushing 40 which is attached to the tube 3, for example by means of a threaded ring 43. The bushing 40 supports the rod 41 via elastic means 42. The bushing 40 is for example made of an electrically insulating synthetic material.

The instrument includes electrical conductors 5 which pass through the handle 2 and the tube 3 and which are linked to an electronic amplification circuit 6. The electronic circuit 6, as shown schematically in FIG. 3, includes elastic pads 60 which come into contact with conductive strips 44 deposited inside the bushing 40, which strips are connected to the sensor 1 as described in detail below.

The sensor 1 is housed inside the bushing 40, guided in a bore 400. It includes a ring-shaped body 10 and a membrane 11 attached to the body 10 by its periphery and extending over a cavity 12 at the center of the body 10. The membrane 11 bears against a second end 412 of the rod 41. The second end 412 of the rod 41 includes a domed surface for bearing against the membrane 11 over a limited area opposite the cavity 12. It is possible for the contact area between the membrane 11 and the rod 41 to be a small proportion of the cross section of the cavity 12 in order to allow the membrane 11 the possibility to flex. The sensor 1 bears elastically against the rod 41 via a pusher 30 that is slidably housed in the tube 3.

The membrane 11 includes, in succession, a carrier layer 111 made of synthetic material, a first conductive layer 112 deposited on the carrier layer 111, a sensitive layer 113 made of piezoelectric synthetic material deposited on the first conductive layer 112 and including a polymer and inorganic nanomaterials, and a second conductive layer 114 deposited on a portion of a free surface of the sensitive layer 113. The membrane 11 is capable of deforming or vibrating above the cavity 12.

The membrane 11 includes at least one notch on its periphery so as to leave a portion of the first conductive layer 112 free. One of the strips 44' is inserted therein so as to make electrical contact with the first conductive layer 112. At least one other strip 44 extends up to the second conductive layer 114 so as to make electrical contact therewith.

The body 10 is for example a silicon substrate obtained by means of techniques used in microelectronics. The cavity 12 is made, for example, by means of optical lithography and deep reactive-ion etching (DRIE). The etching operation is stopped about 50 micrometers before the upper surface of the body 10 so as to keep the former intact for the purpose of carrying out the subsequent manufacturing steps. The membrane 11 is attached by bonding to the non-cavitied face of the body 10 by means of a layer of adhesive 110 spread over said face.

The manufacture of the membrane 11 is described below. The carrier layer 111 is cut into a 25 µm thick laminated polymer film made of polyimide (PI, Kapton®) or polyether ether ketone (PEEK, Aptiv100®). These films have good shape-holding properties. The body 10 and the laminated film are exposed to an oxygen plasma treatment in order to modify their surface states to make them hydrophilic and thus to maximize their chemical affinity with the adhesive 110. The flat face of the body 10 is coated with polydimethylsiloxane (PDMS, Sylgard® 184), acting as the adhesive, by means of the centrifugal spraying technique in order to deposit a uniform thickness. The carrier layer 111 is then applied to the surface of the adhesive 110 by means of a plating method. The assembly is then placed in the oven for 2 hours and 45 minutes (temperature rise time included) at 100° C. for the cross-polymerization step, ensuring the stiffening of the adhesive 110 and its adhesion to the two materials.

After the sample has returned to ambient temperature, the first conductive layer 112 is produced by depositing a 100 nm thickness of aluminum by means of continuous sputtering. The sensitive material is prepared by adding alumina $Al_2O_3$ nanomaterials (Degussa A G, Frankfurt) to vinylidene fluoride and trifluoroethylene copolymer (P(VDF-TrFE), Piezotech SAS) in solution in methyl ethyl ketone (MEK, Sigma Aldrich). The two materials are mixed by ultrasonification with the solution immersed in an ice bath in order to prevent it from heating up. In order to form the sensitive layer 113, the assembly is then covered by means of centrifugal spraying with a layer of the polymer solution and its nanomaterial to a thickness of between 100 nm and 15 µm. The entire assembly is then placed in the oven directly at 138° C. for one hour followed by the time required for it to cool to ambient temperature. Such annealing makes it possible to configure the sensitive layer 113 by recrystallization in order to endow it with piezoelectric properties.

This sensitive layer is then subjected to a polarization step, for example by means of a corona technique, so as to orient the piezoelectric properties for the purpose of maximizing the electrical response of the layer to deformations and vibrations.

The upper electrode is then deposited via the evaporation of a chromium adhesion layer of 10 nm and a thickness of gold of 70 nm for example. This electrode is then structured by means of optical microlithography and wet etching in order to obtain the desired pattern on the surface of the membrane 11. In order to free the vibrationally free zone, the rest of the body 11 at the level of cavity 12 is etched by means of reactive-ion etching (RIE) or wet etching.

In use, a vibrating object is brought into contact with the first end 411 of the rod 41. The vibrations are transmitted by the rod 41 to the membrane 11, which acts as a deformation sensor 1. The deformation of the membrane 11, for example sagging and stretching at the peripheral edges, is piezoelectrically converted to an electrical signal which is collected via the two conductive layers 112, 114 through the creation of a potential difference. The electrical signal is transmitted to the amplification circuit 6 via the strips 44, 44' and the elastic pads 60. The signal provides information on the frequency and amplitude of the vibrations of the probed object. The amplified signal is transmitted to an external device 7 which processes it and provides results by interface means 8.

Figure 7:
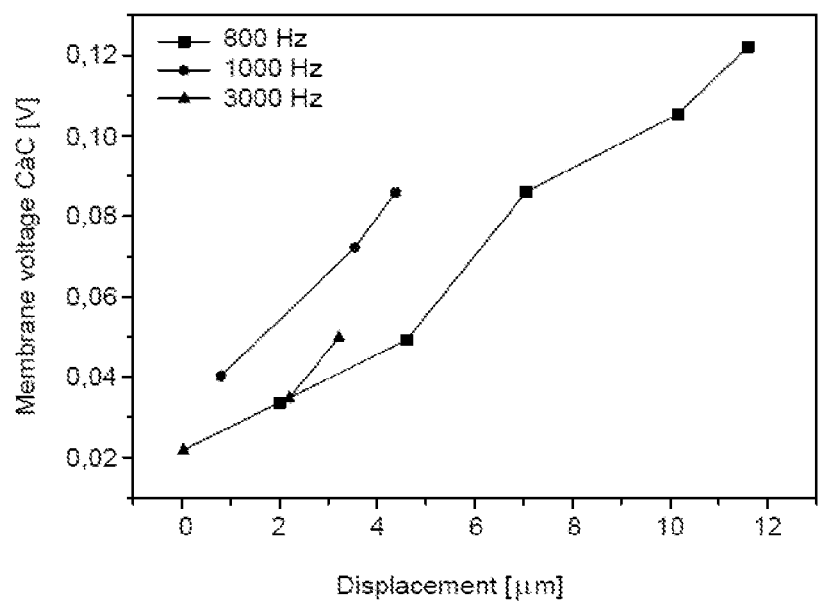
FIG. 7 is a diagram showing an example of a measurement made by a sensor in accordance with the disclosed subject matter subjected to vibrations at various frequencies.

FIG. 7 shows a diagram representing the voltage measured between the conductive layers as a function of the amplitude of stress on the membrane and for certain vibrational frequencies of the membrane under excitation by a shaker for a 7 µm thick layer of P(VDF-TrFE) with 5% $Al_2O_3$ nanomaterials.

Figure 8:
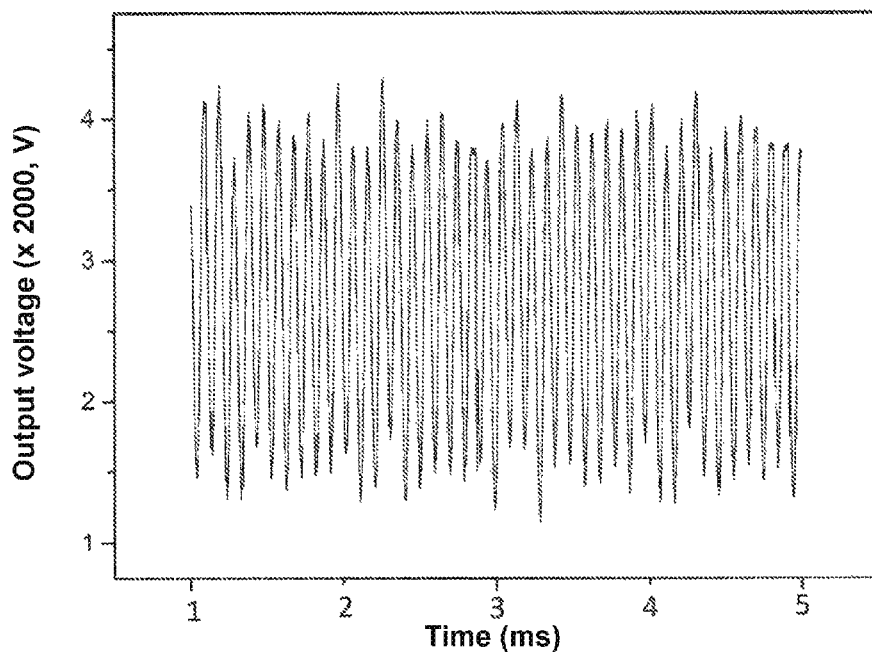
FIG. 8 shows an example of a measured voltage as a function of time at the output of a sensor in accordance with the disclosed subject matter.

FIG. 8 shows an example of voltage measured as a function of time at the output of the sensor in accordance with the disclosed subject matter made from a piezoelectric nanocomposite membrane. The amplitude of mechanical excitation is 20 nm.

Figure 9:
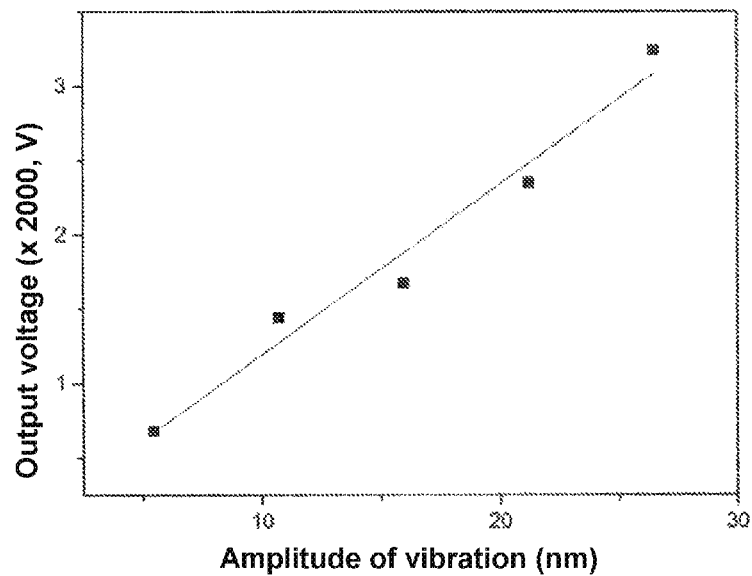
FIG. 9 shows the voltage measured at the output of a sensor in accordance with the disclosed subject matter as a function of the amplitude of the mechanical vibration transmitted to the membrane.

FIG. 9 shows the variation in the voltage measured at the output of said sensor, as a function of the amplitude of the mechanical vibration transmitted to the membrane.

For both Figures, the vibrational frequency is 1024 Hz and the voltage obtained is shown in volts after 2000× amplification.

As shown in these two FIGS. 8 and 9, the sensor in accordance with the disclosed subject matter is capable of detecting mechanical vibrations of a few nanometers in amplitude.

The probed object is for example one of the ossicles of the middle ear during a surgical operation. This allows the surgeon to ensure that the chain of ossicles at least partially retains its functionality. The surgeon can thus determine which part remains functional and should be retained. The instrument can also be used to evaluate the effectiveness of an implant after its implantation. It can also be used to determine a bearing force on an implant. The surgical procedure is adjusted accordingly to ensure optimal results after surgery.

The invention claimed is:

1. An instrument, comprising:
 a piezoelectric sensor, including:
  a body with a central cavity;
  a membrane extending over the cavity;
  the membrane being attached to the body via its periphery and includes a carrier layer made of polymer and a sensitive layer) made of piezoelectric polymer material; and
  the membrane being capable of deforming or vibrating, wherein
   the sensitive layer is made of a material comprising a polymer filled with $Al_2O_3$ inorganic nanomaterials and not filled with organic nanomaterials;
   the polymer of the sensitive layer is selected from the group comprising polyvinylidene fluoride (PVDF), vinylidene fluoride and trifluoroethylene copolymer P(VDF-TrFE) and polyamide-11;
   the carrier layer is made of a material selected from the group including polyimide (PI) and polyether ether ketone (PEEK);
   a first aluminium conductive layer is interposed between the carrier layer and the sensitive layer;
   a second conductive layer is deposited on a portion of a free surface of the sensitive layer; and
   a transmission rod, a first end of which is intended to be applied against a mass that is capable of vibrating, and a second end of which bears against the membrane of the sensor.

2. The instrument as claimed in claim 1, wherein the nanomaterials are made of an inorganic material such as metals, semiconductors or dielectrics.

3. The instrument as claimed in claim 1, wherein the thickness of the carrier layer is between 5 and 150 µm.

4. The instrument as claimed in claim 1, wherein the membrane is attached to the body by bonding.

5. The instrument as claimed in claim 4, wherein the membrane is attached to the body by the carrier layer.

6. The instrument as claimed in claim 1, further including a head in which the sensor is housed, the rod being linked by an elastic mechanism to the head.

7. The instrument as claimed in claim 1, wherein the second end of the rod includes a domed surface for bearing against the membrane.

8. The instrument as claimed in claim 1, wherein the thickness of the carrier layer is 25 µm.

\* \* \* \* \*